SOLDER LEVELING APPARATUS

Filed July 6, 1967 2 Sheets-Sheet 1

INVENTORS
JOHN H. McLAIN
BOBBY J. PORTER

BY Brown, Schuyler & Beveridge
ATTORNEYS

INVENTORS

JOHN H. Mc LAIN

BOBBY J. PORTER

BY Browne, Schuyler & Beveridge

ATTORNEYS

United States Patent Office 3,491,779

Patented Jan. 27, 1970

3,491,779

SOLDER LEVELING APPARATUS

John H. McLain, Huntsville, and Bobby J. Porter, Madison, Ala., assignors to Brown Engineering Company, Inc., Huntsville, Ala., a corporation of California Filed July 6, 1967, Ser. No. 651,417

Int. Cl. B05b *13/02;* C23c *7/00*

U.S. Cl. 134—104 12 Claims

ABSTRACT OF THE DISCLOSURE

Apparatus for establishing a level coating of solder of uniform thickness on metallic surfaces such as the circuitry of printed circuit boards, utilizes a tank containing a volume of fluid maintained at a temperature substantially above that of the melting point of the solder with a conveyor carrying the metallic surfaces, such as printed circuit boards, across the top of the tank and a pump submerged in the hot fluid directing a converging spray of hot fluid at an acute angle onto both sides of the metallic surfaces opposite their direction of motion as they pass across the top of the tank. Oil or a molten salt is utilized as the fluid.

This invention involves an apparatus for establishing a level coating of solder of uniform thickness on metallic surfaces and is particularly adapted to establishing a uniformly thick and level coating of solder on the printed copper circuits of circuit boards.

Providing a protective coating on the copper of circuit boards to prevent oxidation has presented a problem for a number of years. Initially, gold plating was utilized but is expensive and, while it has good corrosive resistant qualities, it does not provide the ideal wettability of a solder surface. The ideal wettability has been approximated by tinning the copper circuits by dipping them in molten solder. However, after dipping the board in solder, the solder coating is uneven and does not produce the uniform thickness of 40 to 300 millionths of an inch desired of solder which is considered optimum.

In order to produce an even and thin coating of solder on the circuit boards, it was previously the practice to subject the boards to a dip and spin or dip and sling operation which leveled the uneven solder coating through the centrifugal forces generated. However, these methods shortened the operational life of the circuit boards at their operational temperatures and increased the probability of lifted pads and delamination. Further, these previously used methods resulted in a relatively poor thickness control and an uneven coating of the solder resulted as well as a relatively low production rate.

A primary object of this invention is to develop an improved apparatus for establishing a level coating of solder of uniform thickness on metallic surfaces, such as the circuits of printed circuit boards.

Another object of this invention is to develop an improved apparatus for leveling solder on metallic surfaces, such as printed circuit boards, in which the coated elements are subjected to minimum acceleration forces.

Yet another object of this invention is to develop an improved apparatus for leveling solder on metallic surfaces at a high production rate.

Yet still another object of this invention is to develop an improved apparatus for establishing a level coating of solder of uniform thickness on metallic surfaces in which the thickness can be controlled in the range of 40 to 300 millionths of an inch.

The above objects have been achieved in the apparatus more fully disclosed below in which the circuit boards are conveyed across the top of a tank containing a volume of fluid, such as oil or a water soluble tempering salt, and a pump submerged in the fluid directs a converging spray of the hot fluid, which is maintained at a temperature substantially above the melting point of the solder, onto both sides of the circuit boards opposite their direction of motion as they pass across the top of the tank. The spray acts as a liquid "squeegee" and levels the irregular coating of solder on the circuits to a uniformly even and smooth layer. All holes are left solder free except for plated-through-hole boards which are intentionally left with a thin, uniform solder coating.

The various advantages of this invention will hereinafter become more fully apparent from the following description of the attached drawings which illustrate a preferred embodiment, and wherein.

Figure 1:
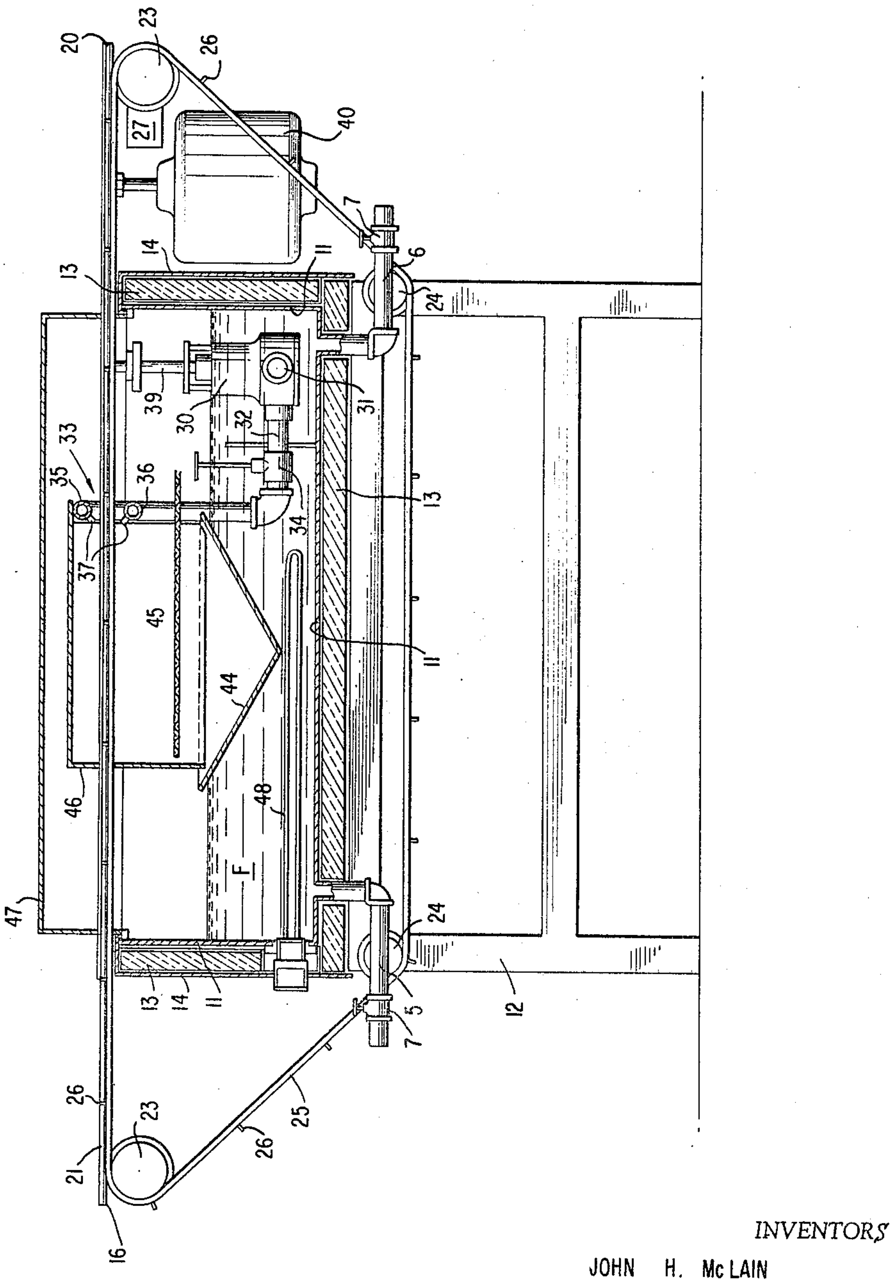
FIGURE 1 is a side elevation in section of a preferred embodiment of the apparatus.
Figure 2:
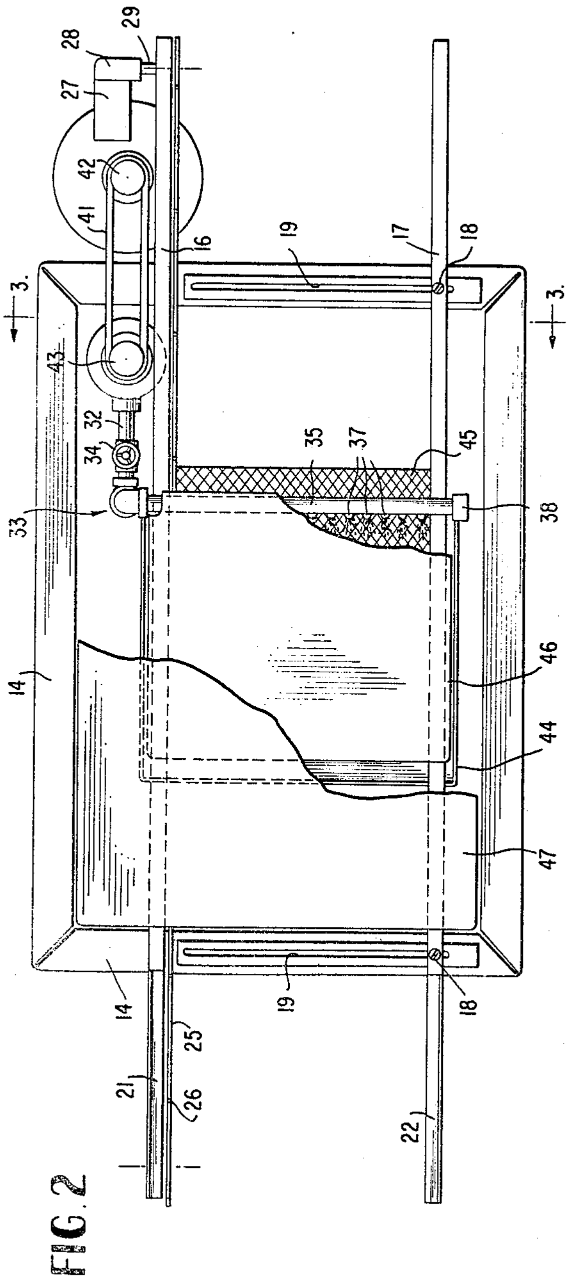
FIGURE 2 is a plan view of the apparatus of FIGURE 1, partially cut away.
Figure 3:
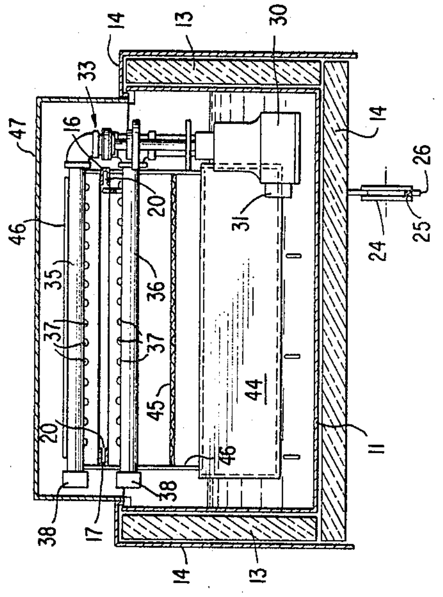
FIGURE 3 is a section taken along lines 3—3 of FIGURE 2.

A preferred embodiment of the apparatus is illustrated in FIGURES 1–3 in which a generally rectangular tank 11 with four sides and a bottom is supported atop a foundation 12 with panels of insulation 13 being mounted against the exterior sides and bottom of the tank 11 and a lower outer cover 14 encompassing the side insulation panels 13 to enclose the sides of the tank. Pipes 5 and 6 containing valves 7 are connected to the bottom of the tank 11 as filling and draining lines for the fluid F with which the tank 11 is filled to a predetermined level indicated in FIGURES 1 and 3 to be approximately 50 percent of the volume of the tank, although this specific amount is not at all critical. The sources of supply and drainage are not shown.

The fluid in the tank 11 must be of a composition that it will not boil at a temperature substantially above the melting point of the solder which is to be leveled. The fluid can be an oil such as "Peblum" made by the Shell Oil Company or can be a molten salt such as water soluble tempering salts of which potassium nitrate, Tempering-312 produced by the Holden Company has proven to be quite satisfactory.

Two circuit board supporting channels 16 and 17 extend across the top of the tank 11 lengthwise of the tank with one channel 16 being affixed to the top of the front and rear sides of the tank adjacent to but a short distance inside one edge of the tank, the other channel 17 being spaced from the first channel 16 in a parallel relationship on the opposite side of the tank but being adjustably affixed to the tank through the bolts 18 which fit into and are slidably affixable along the length of the slots 19 extending along the top edges of the front and rear walls of the tank 11 so that the horizontal spacing between the two channels 16 and 17 may be adjusted. The channels 16 and 17 are generally C-shaped in cross section, as is best seen in FIGURE 3, having a groove 20 extending longitudinally of the channel and the channels are mounted to have the grooves facing inwardly toward each other. The top portion of each of the channels 16 and 17, which extends forwardly ahead of the front side of the tank 11, is cut away, as indicated at 21 and 22 on the channels 16 and 17, respectively, to expose the interior of the groove 20. If the adjustable channel 17 is located a distance abreast of the fixed channel 16 such that opposite edges of the circuit boards to be processed are supportingly carried within the two opposing grooves 20 of the opposite channels, the two exposed portions 21 and 22 will permit the circuit boards to be laid flat onto the bottom surfaces of the interior grooves 20 on the feed end of the channels 16 and 17 ahead of the tank 11. Obviously, the spacing between the two channels 16 and 17 must be adjusted so that the circuit boards span the two channels and the opposite edges are carried within the grooves 20 of the opposing channel as the boards are moved along the length of the two channels to pass over the tank 11. Although the channels 16 and 17 are indicated to be supported by the top segment of the outer covers 14 of the tank, the channels could obviously be supported directly from the foundation which supports the tank or from other convenient structure.

Two vertically mounted upper conveyor sprockets 23 are supported (structure not indicated) adjacent the opposite ends of the fixed channel 16 slightly below the level of the channels and two lower conveyor sprockets 24 are supported in a vertical plane below the bottom of the tank 11. An endless link chain 25 is carried by the sprockets 23 and 24 as a closed loop conveyor, the chain 25 at spaced intervals along its length having outwardly protruding engaging elements 26 which extend outwardly from the loop formed by the chain. The chain carrying sprockets 23 and 24 are located between the two channels 16 and 17 so that the chain 25 lies closely adjacent the fixed channel 16 with the upper horizontal run of the chain 25 being parallel to the channels and slightly below them. The engaging elements 26 are sufficiently long that they protrude upwardly along the upper horizontal run of the chain 25 to extend slightly above the top of the grooves 20. A small motor 27 is connected through a gear box 28 to the shaft 29 of one of the driving sprockets 23. Operation of the motor 27 will rotate the driving sprocket 23 in a direction to cause the conveyor chain 25 to be driven in a clockwise direction as seen in FIGURE 1, whereby the protruding engaging elements 26 will contact the rear of a circuit board placed in the exposed groove sections 21 and 22 of the supporting channels and carry the circuit board along the length of the two channels 16 and 17 to exit from the grooves 20 at the lower or discharge end of the apparatus.

A pump 30 is supported by structure not shown within the tank 11 and is submerged within the fluid F with its intake 31 near the bottom of the tank. The pump discharges through a line 32 to a manifold 33 lying above the level of the fluid in the tank via a control valve 34. The manifold includes two horizontally arranged discharge pipes 35 and 36 lying transversely of the support channels 16 and 17 with one of the discharge pipes 35 being above the supporting channels and the other 36 below them, the two pipes being parallel and in vertical alignment. A plurality of spray nozzles 37 spaced along the length of both discharge pipes 36 and 37 connect to the pipe interiors, the upper spray nozzles being inclined downwardly and the lower spray nozzles being inclined upwardly to point in a direction opposite to that in which the conveyor chain 25 is moving such that the discharge from the spray nozzles converges substantially in the plane of the supporting channels 16 and 17. The far ends of the discharge pipes are closed by means of caps 38 or other similar arrangement. The nozzles 37 are inclined at an angle of between 40° and 60° to the plane of the supporting channels 16 and 17 with an optimum angle being approximately 50°. The vertically extending drive shaft 39 of the pump is rotated by the pump motor 40, which is supported outside the tank (structure not shown), through the drive belt 41 and the motor pulley 42 and the pump shaft pulley 43. A pump having a normal discharge pressure of approximately 20 pounds per square inch and a capacity of 18 gallons per minute has been quite satisfactory.

A solder trap 44, generally triangular in side cross section as may be seen in FIGURE 1, is supported (structure not shown) within the tank below the level of the supporting channels 16 and 17 with the rear of the solder trap being below the discharge pipes 35 and 36 and the forward edge of the solder trap being located well forwardly in the front end portion of the tank, the solder trap extending transversely to span the spray nozzles 37. A screen 45 overlies the solder trap 44. The space above the solder trap is enclosed on both sides, the front and the top by an inner cover 46 which extends above the top discharge pipe 35 to contain the fluid sprayed into this space by the nozzles 37. An outer upper cover 47 extending upwardly around the outer periphery of the tank 11 encloses the space above the top of the tank above the level of the inner cover 46 to fully contain the tank and prevent spray from escaping.

An immersion heater 48 extends through and is supported by the front wall of the tank 11 near the bottom to extend inwardly parallel to the tank bottom and provide a heating source for the fluid F. The particular heater which has been used is a six kilowatt heater with a 20 watt surface density. The electrical power to the heater is regulated by suitable controls (not shown) to maintain the fluid F in the tank at a suitable operating temperature. This temperature should be substantially above the melting point of the solder with which the circuits of the circuit board are coated and should be in the range of approximately 40° to 60° F. above the solder melting point. When utilizing a eutectic solder (63 percent tin–37 percent lead), which has a melting point of approximately 380° F., a fluid temperature of approximately 430° F. has been found to be quite suitable.

The preliminary coating of solder on the copper circuits of the printed circuit boards can be applied by wave-soldering or an electrodepositing operation. Obviously this initial coating need not be applied in the vicinity of the apparatus disclosed herein nor within any particular time period prior to the leveling operation. In other words, the preliminary coating of solder can be applied well ahead of time and the circuit boards stored until it is convenient to run them through the solder leveling machine. Of course, any other suitable methods of applying a rough coating of solder can be utilized. In operating the machine, the adjustable supporting channel 17 should be located abreast of the fixed channel 16 a distance such that the innermost portions of the grooves 20 are spaced apart a distance slightly less than the width of the circuit board so that the edges of the circuit boards will be supported within the grooves 20 of the supporting channels and can freely slide the entire length of the channels when contacted by the engaging elements 26 of the conveyor. Each circuit board is placed on the exposed sections 21 and 22 at the front feed end of the supporting channels so that the board is supported by its opposite edges. The rear end of the board will then be engaged by an engaging element 26 of the moving conveyor chain 25 and carried down the length of the supporting channels over the top of the tank and through the spray discharged from the spray nozzles 37. The speed of the conveyor chain 25 is adjusted by varying the speed of the driving motor 27, a normal operating speed being between approximately 5 feet per minute to 8 feet per minute. When the hot liquid spray from the spray nozzles impinges on the top and bottom sides of the circuit board, the solder is melted and the combination of the pressure and velocity of the sprayed liquid acts as a liquid "squeegee" to spread the solder over the printed circuit into a level and even coating of uniform thickness, any excess solder being washed off the board and falling into the solder trap. The thickness of the final solder coating can be adjusted by varying the speed of the conveyor and adjusting the temperature of the leveling fluid.

Although this apparatus is primarily useful for obtaining a uniformly thick and smooth coating of solder on the circuits of printed circuit boards, obviously the apparatus can be adapted to applying a level coating of solder of uniform thickness on any metallic surface to which a preliminary coating of solder has been applied. Of course, the metallic surfaces on which the solder coating is being leveled must be fully exposed to the hot liquid spray and must be suitably supported as they are carried through the spray discharge.

What is claimed is:

1. An apparatus for establishing a level coating of solder of uniform thickness on metallic surfaces to which solder has been applied, said apparatus comprising an insulated tank with inlet and outlet connections for filling the tank to a predetermined level with a high boiling point fluid, means for supporting and moving a solder covered surface along a path passing across the open top portion of said tank with the solder surfaces exposed, a plurality of spray nozzles supported above the predetermined fluid level in said tank on opposite sides of said path with the discharge from oppositely positioned nozzles converging on said path at an acute angle thereto, means for maintaining the fluid within said tank at an established temperature substantially above the melting point of the solder coating on the metallic surfaces, a pump supported within said tank with its intake below the predetermined level of fluid and its discharge connected to said nozzles, means for actuating said pump to cause the hot fluid to be discharged from said nozzles under pressure and a solder trap having an open top supported within said tank below said nozzles with the open top portion of said trap extending a substantial distance ahead of said nozzles in the discharge direction.

2. The apparatus described in claim 1 wherein said pump is submerged within the heated fluid in said tank.

3. The apparatus described in claim 2 wherein said nozzles are arranged in an upper group comprising a plurality of juxtaposed downwardly directed nozzles lying above and extending transversely across said path and a lower group comprising a plurality of juxtaposed upwardly directed nozzles lying beneath and extending transversely across said path.

4. The apparatus as described in claim 3 wherein the nozzles of said upper and lower groups are inclined at an angle such that the streams of fluid discharged thereof intersect substantially in the plane of said path and ahead of said nozzles in a direction opposite that of the movement of said supporting and moving means, said nozzle groups being substantially vertically above the rear portion of said solder trap.

5. The apparatus as described in claim 4 wherein the nozzles of each group are arranged abreast in a line parallel to each other and perpendicular to said path with the nozzles inclined at approximately 50° to said path.

6. The apparatus as described in claim 4 wherein said supporting and moving means comprises two C-shaped grooved channels, means for affixing one of said channels to said tank adjacent one side thereof with the groove horizontal and facing the center of the tank, means for clamping the other of said channels to said tank a variable distance opposite said first channel in a parallel relationship with the grooves of said channels facing each other to contain and support the edges of boards carrying the solder coated metallic surfaces along said path defined between said channels and a conveyor means moving parallel to said channels with a portion of said conveyor contacting the boards to move them the length of said channels, the top portion of each channel above the groove and extending ahead of the front edge of said tank opposite the direction of said conveyor means being removed to expose the grooves in the channel forward portions.

7. The apparatus as described in claim 6 wherein said conveyor means comprises an endless loop supported in a vertical plane around pulleys, a plurality of board contacting elements affixed to said loop to extend vertically therefrom at spaced intervals along its periphery and driving means for moving said loop circumferentially about said supporting pulleys.

8. The apparatus as described in claim 7 wherein said loop is a continuous link chain and said driving means comprises a motor connected to rotate one of said pulleys having sprockets which engage said chain.

9. The apparatus as described in claim 6 wherein a screen is positioned to overlie said solder trap between said trap and said nozzles and extends from adjacent the rear edge of said trap to adjacent the front edge thereof.

10. The apparatus as described in claim 9 wherein the space above said solder trap is enclosed on at least three sides by an inner cover having side panels extending upwardly from both sides and the front edge of said solder trap to a point above the upper nozzle group and a top panel extending rearwardly adjacent said nozzles, the front panel having a cut-out section between said channels to accommodate the passage of the solder coated surfaces along said path.

11. The apparatus as described in claim 10 wherein the space above said tank is enclosed by an outer cover having front, rear and side panel sections extending upwardly from around the peripheral edges of said tank to above said inner cover and a top panel section extending between the upper edges of said panel sections, the front and rear panel sections having cut-out area between said channels extending therethrough to accommodate the passage of the solder coated surfaces along said path.

12. The apparatus as described in claim 11 wherein said heating means comprises an immersion heater affixed to a wall of said tank adjacent the bottom thereof to extend inwardly into the interior of said tank.

References Cited

UNITED STATES PATENTS

| | | | |
|---|---|---|---|
| 1,446,579 | 2/1923 | Paulson | 134—104 |
| 1,491,211 | 4/1924 | Talor | 134—131 XR |
| 2,128,028 | 8/1938 | Hampton | 134—131 XR |
| 2,172,471 | 9/1939 | Grow | 134—131 XR |
| 2,940,458 | 6/1960 | Speckman | 134—104 XR |
| 3,174,491 | 3/1965 | Faler | 134—105 XR |
| 3,261,368 | 7/1966 | Owens et al. | 134—104 |

ROBERT L. BLEUTGE, Primary Examiner

U.S. Cl. X.R.

134—108, 111, 130, 131; 228—20; 266—6